United States Patent
Crimmins

Patent Number: 5,319,191
Date of Patent: Jun. 7, 1994

[54] ASK RECEIVER WITH SIGNAL DELAY AND STRETCHING

[75] Inventor: James W. Crimmins, Wilton, Conn.

[73] Assignee: K & M Electronics, Inc., West Springfield, Mass.

[21] Appl. No.: 36,914

[22] Filed: Mar. 25, 1993

[51] Int. Cl.⁵ ............................................. H01J 40/14
[52] U.S. Cl. ................................. 250/214 R; 359/181
[58] Field of Search ............ 250/214 R, 214 AL, 551; 359/181, 182, 183; 329/304; 370/110.1

[56] References Cited

U.S. PATENT DOCUMENTS

| | | |
|---|---|---|
| 4,431,916 | 2/1983 | Couch . |
| 4,507,795 | 3/1985 | Wagner . |
| 4,829,560 | 5/1989 | Evanyk et al. . |
| 4,860,320 | 8/1989 | Hoffmann . |
| 4,947,407 | 8/1990 | Silvian . |
| 5,016,246 | 5/1991 | Wisniewski . |
| 5,017,794 | 5/1991 | Linwood et al. ............ 250/214 AL |
| 5,017,885 | 5/1991 | Saleh . |
| 5,075,792 | 12/1991 | Brown . |
| 5,077,728 | 12/1991 | Kaminow . |

*Primary Examiner*—David C. Nelms
*Attorney, Agent, or Firm*—St. Onge Steward Johnston & Reens

[57] ABSTRACT

An amplitude-shift-keyed (ASK) receiver is described for use in receiving infrared ASK modulated carrier signals wherein a delayed version of a demodulated pulse os compared with a stretched version and a dynamic threshold signal to reproduce binary data pulses. The dynamic threshold signal is further compared with the stretched version to derive an indication of the amplitude of the incident optical carrier. An embodiment illustrating use of the ASK receiver in an infrared communication system is described.

17 Claims, 2 Drawing Sheets

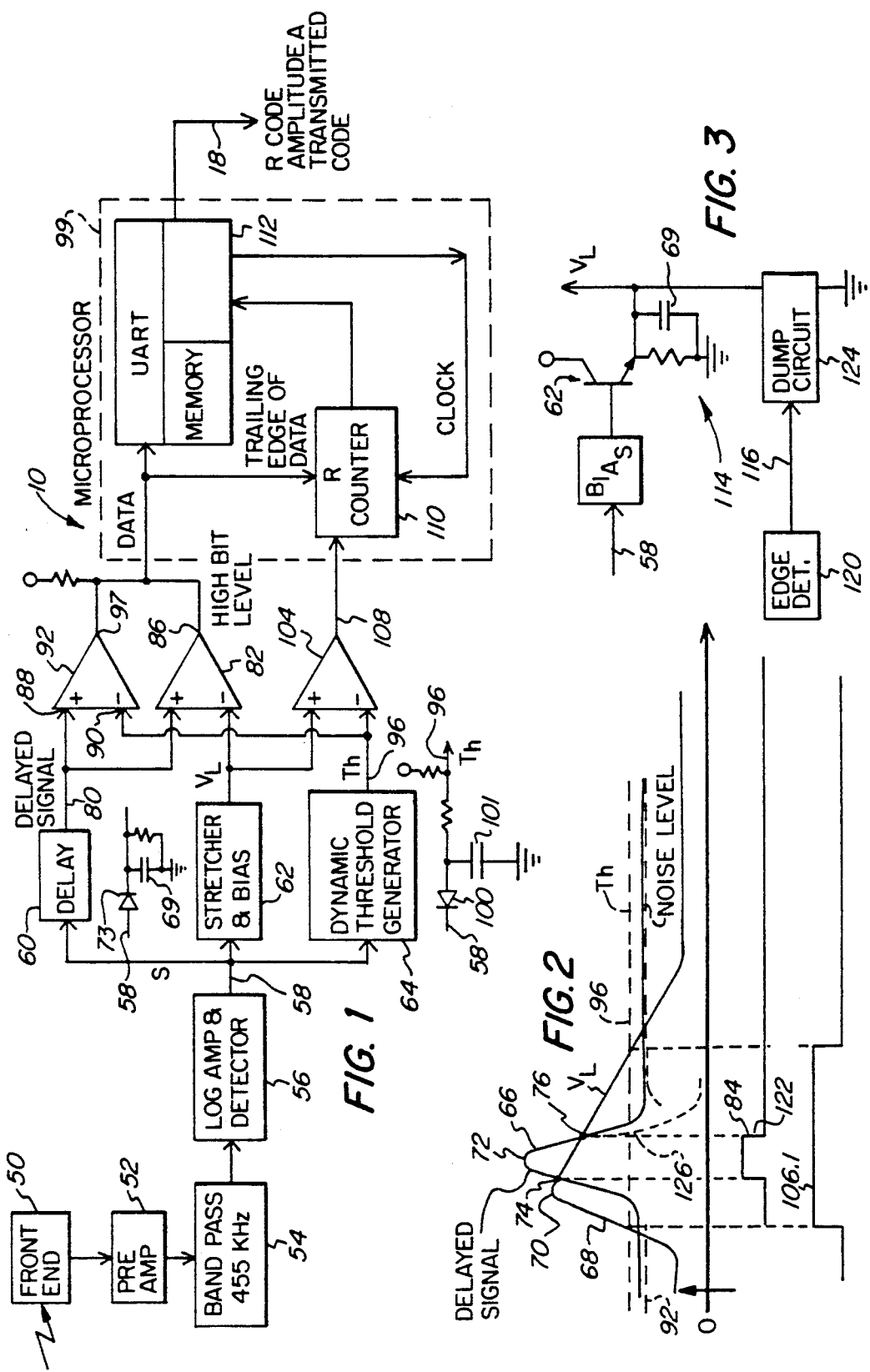

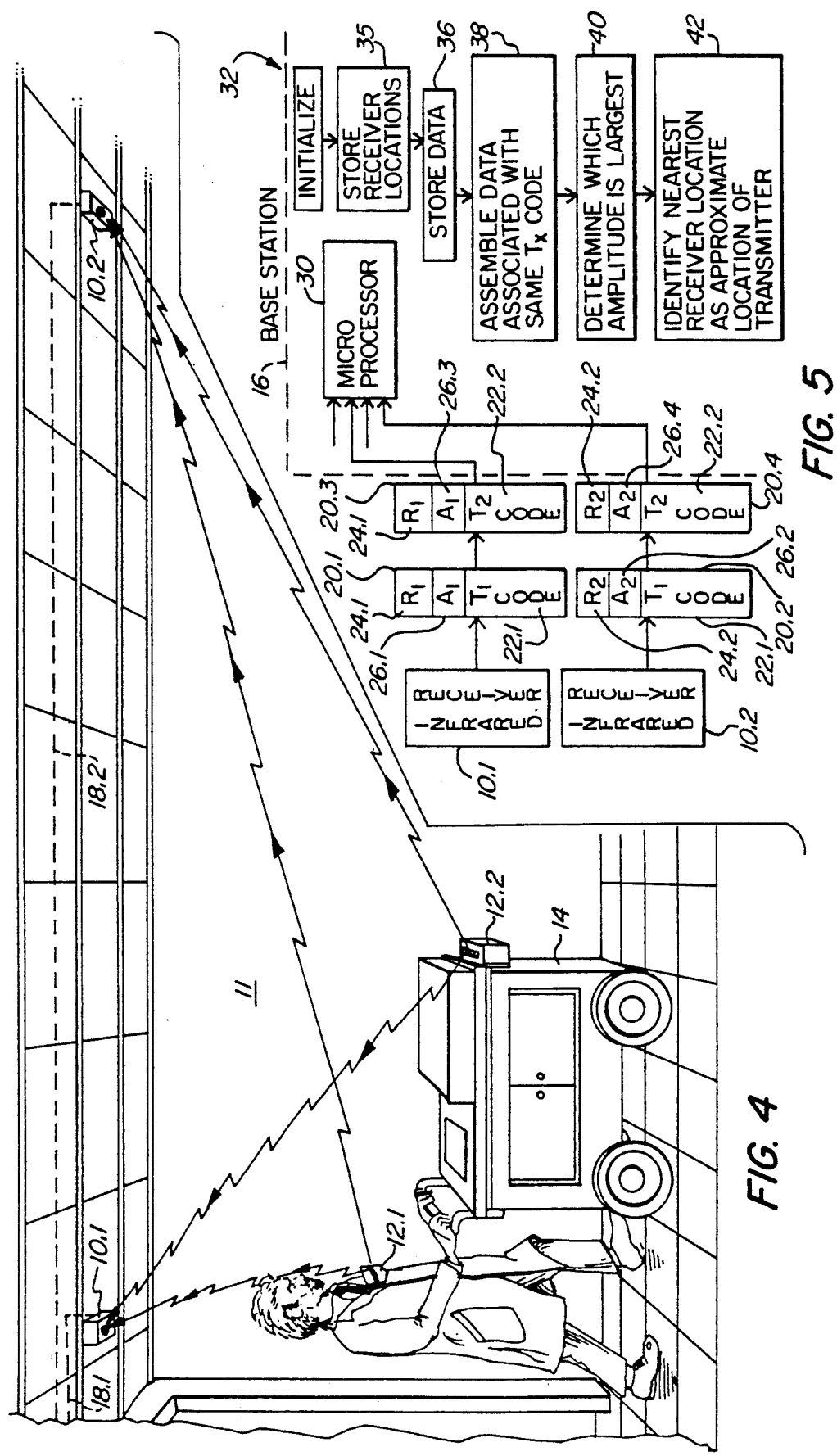

ASK RECEIVER WITH SIGNAL DELAY AND STRETCHING

FIELD OF THE INVENTION

This invention relates generally to an amplitude-shift-keyed (ASK) receiver and more specifically to an infrared receiver for an amplitude-shift-keyed (ASK) modulated infrared carrier communication system.

BACKGROUND OF THE INVENTION

Amplitude-shift-keyed modulation is a commonly known technique used to modulate rf and optical carriers for the transmission of data. A typical transmission involves sending bursts of carrier signals, the presence of a burst identifying a binary one or zero and the absence of a burst or carrier being representative of the opposite binary digit. Examples of patents describing various ASK modulations are U.S. Pat. Nos. 4,947,407, 4,860,320, and 4,829,560.

Techniques for improving detection of data signals detected with optical receivers are known in the art. In one such technique as shown and described in U.S. Pat. No. 4,431,916 delayed versions of input signals are compared with undelayed versions to reproduce data signals. Threshold values are created from these signals. U.S. Pat. No. 4,507,795 describes an apparatus for locating leading and trailing edges of pulses derived from an RF input.

One problem associated with ASK receivers involves the large amplitude swings of incident RF or optical carrier signals. Such large swings tend to introduce undesirable variations in the output data pulse width. Such variations often are due to the receiver's bandpass filtering which causes sloping, rising and falling edges at the output of the logarithmic amplifier that is commonly used in receivers.

SUMMARY OF THE INVENTION

With one ASK receiver in accordance with the invention, data pulses can be reproduced from an incoming signal substantially independent of its amplitude. This is achieved by comparing delayed and level shifted stretched versions. The comparison reproduces a high bit level data signal representative of one binary digit provided the delayed version exceeds a threshold which is greater than the signal noise level.

With an ASK receiver in accordance with the invention, significant improvement in the detection of data pulses is obtained. Problems commonly associated with AGC and squelch circuitry are avoided.

An ASK receiver in accordance with the invention furthermore can provide a consistently reliable indication of the carrier signal level incident at the receiver. This is obtained by comparing the stretched version with a threshold to produce a level pulse whose duration is representative of the carrier signal level. The level pulse can then be converted to a digital value by means such as a microprocessor to provide a digital indication of the carrier signal level and, therefore, an indication of the distance of the source of the carrier signals from the receiver.

An ASK receiver of this invention is conveniently used to determine the location of a transmission source. This is achieved by using the measured amplitude of an incident infrared carrier at a plurality of infrared receivers and comparing the measurements. Since the receiver locations are known, the largest amplitude measurement and its associated receiver are then selected as the approximate location for the source of the transmitter.

Measuring of the infrared carrier amplitude can be carried out by generating a signal that is a dynamic representation of the noise level at each receiver input or alternatively by using a fixed threshold voltage which is greater than the noise level. The threshold signal is then compared with a modified version of a carrier pulse to derive a measurement of the magnitude of the carrier signal at the receiver input.

It is, therefore, an object of the invention to provide an ASK receiver which can reliably reproduce data signals from an ASK modulated carrier, substantially independent of the incident intensity of the carrier signal. It is still further an object of the invention to provide as ASK receiver from which a signal representative of the magnitude of the incident carrier signal can be conveniently derived for use in determining the location of the source of the carrier. It is still further, therefore, an object of the invention to provide a convenient technique for determining the location of a person or object using an ASK infrared communication system.

These and other objects and advantages of the invention can be understood from the following detailed description of a preferred embodiment and variations thereof as illustrated in the drawings and described in further detail below.

BRIEF DESCRIPTION OF DRAWINGS

FIG. 1 is a schematic view of as ASK receiver in accordance with the invention;

FIG. 2 is a plot of various waveforms generated within the receiver circuit shown in FIG. 2;

FIG. 3 is a schematic of an alternate form for a portion of the circuit of FIG. 2;

FIG. 4 is a simplified perspective view of an installation of an infrared ASK communication system in accordance with the invention for use within a building to locate people or portable equipment; and FIG. 5 is a block diagram and process steps employed to determine the location of a transmitter;

DETAILED DESCRIPTION OF DRAWINGS

The reliable detection of ASK infrared transmissions is obtained with an ASK optical receiver 10 as more particularly shown in FIGS. 1-3. In FIG. 1 a photodetector 50 is employed as an optical front end. An electrical signal representative of the detected infrared carrier burst from an ASK badge transmitter is amplified by a preamplifier 52 and then passed through a bandpass filter 54 centered at the optical carrier frequency from the badge transmitters. The output from filter 54 is applied to a logarithmic amplifier 56 which has a detector for generating on output line 58 an ASK modulation signal representative of the ASK modulated optical carrier. A standard FM receiver chip can be used to generate the ASK modulation signal.

The ASK modulation signal is formed of high bit level pulses representative of one binary digit and arise from the presence of an optical carrier signal at a front end 50. The other binary digit is represented by the absence of a carrier signal and thus can be characterized as a low bit level. The ASK modulation signal on line 58 is applied to three networks, a delay circuit 60, a signal stretcher 62, and a threshold generator 64. The delay circuit 60 delays the detected signals by a short duration, of the order of 100 nanoseconds. A high bit level delayed pulse 66 is shown in FIG. 2.

The signal stretcher 62 generates a stretched pulse 68 with capacitor 69, which is rapidly charged to a peak level 70 which is kept below the peak level 72 of delayed pulse 66 with a bias voltage developed across diode 73. The discharge of the capacitor is stretched so as to provide two intersections 74, 76 where the values of the delayed pulse 66 and the stretched pulse 68 are the same.

The delayed signal on output 80 from delay circuit 60 is compared by comparator 82 with the stretched pulse 68. This results in a data pulse 84 on output line 86 indicative of the one binary digit indicated by the high bit level, provided the conditions at the inputs 88, 90 to comparator 92 are also satisfied. This enabling condition arises when the delayed signal level also exceeds the threshold level Th at the output 96 of the threshold generator 64. This AND function is obtained by connecting the outputs 86 and 97 of comparators 82 and 92 together. The outputs 86, 97 carry the data signal in the ASK modulation to a microprocessor 99.

The threshold generator 64 produces threshold signal Th on output 96 which is a combination of the noise level 98 at the output of the log amplifier 65 plus a bias to assure that the threshold level is above the noise level. The bias is selected so that the detection of the high bit level is not disrupted by noise. The bias is provided by the voltage drop across diode 100; the threshold level is developed across a capacitor 101. The threshold signal Th is dynamic in the sense that it varies with the noise level in the ASK modulation signal. A fixed voltage for a threshold level Th could be used.

The use of a stretched version of the ASK modulation signal is particularly advantageous for the determination of the amplitude or intensity of the infrared carrier signal incident at the photo detector 50. This amplitude is measured with comparator 104 that has its inputs coupled to the stretched signal version 68 and the threshold signal Th on the output 96.

Whenever the stretched signal exceeds the threshold level, a pulse 106 is produced on output 108. The larger the carrier signal at photo detector 50, the higher peak 70 of the stretched signal and thus a longer pulse 106. The duration of pulse 106 then becomes a measurement of the carrier signal level. By applying pulses 106 to a counter 110 in processor 99, the duration of pulses 106 are converted to a digital indication in the form of a binary number.

In processor 99, the input data signal is converted to the proper binary code. For asynchronous format the processor acts as a UART. Hence, inside processor 99, incoming data is converted to ones and zeros. Each pulse on line 97 causes a resetting of counter 110. Only after the last pulse in the fixed length transmission has reset the counter 110 is a measurement of the amplitude accumulated in the counter. A count of the pulse 106.1 duration after the occurence of the trailing edge 122 of pulse 84 at the output of comparator is then obtained in counter 110. The count is stored in memory as a measurement of the intensity of the incident carrier signal level.

Within processor 99, the data received from each received transmission 20 is stored together with the measured amplitude of the incident carrier level, and, if desired, a tag which identifies the receiver. This data is then transmitted to a base station on a line 18 for further processing. Suitable logic 112 is used within the processor 99.

Having thus described the invention, its advantages can be appreciated. Variations can be made. For example, in cases where a higher ASK modulation frequency is used, the discharge of capacitor 69 can be accelerated. This can use a circuit 114 as illustrated in FIG. 3. A circuit 120 or the processor 99 produces a pulse on line 116 at each trailing edge 122 of a detected binary digit represented by pulse 66. The trailing edge 122 activates a dump circuit 124, such as a semiconductor switch, which quickly discharges capacitor 69. As a result, the stretched waveform 68 has a rapidly decaying slope as suggested by dashed line 126 in FIG. 2.

A particular advantage of an ASK receiver in accordance with the invention is based on its ability to conveniently provide a signal indicative of the amplitude of the incoming infrared carrier signal.

With reference to FIGS. 3 and 4, one application for an ASK receiver 10 in accordance with the invention is shown. The receivers 10.1 and 10.2 are part of an overall ASK infrared communication system 11 which involves optical communications from infrared transmitter badges 12.1 and 12.2 worn by a person or on a piece of equipment 14. The communication system can be for purposes of locating specific instruments in a hospital, for example. In such case, infrared receivers are mounted to ceilings or other surfaces and distributed throughout the building in such manner that a portable infrared transmitter 12 can always be in communication with at least one receiver 10. Frequently, because of the ability to communicate around corners by way of multiple reflections of the infrared transmission, more than one receiver 10 may receive the same infrared transmission from one common transmitter 12.

The badges 12 send bursts of infrared to transmit a code uniquely identifying the transmitter and thus the person and equipment 14 to receivers 10. An infrared ASK transmitter for such badge is described in my copending patent application entitled "An ASK Optical Transmitter", assigned to the same assignee as of this invention and filed on Mar. 25, 1993, the same date as this patent application.

The receivers 10.1 and 10.2 detect the infrared transmissions from all badges 12 in the vicinity. The receivers 10 communicate the information received from a transmitter 12 to a base station 16 via coax, or twisted wire 18 or other convenient media. The receiver's transmission to the base station is sent in short bursts 20 and includes the detected transmitter code 22, a tag 24, which identifies the receiver 10 which detected the infrared burst, and an amplitude signal 26 representative of the amplitude of the infrared incident on the receiver 10. Alternatively, instead of tag 24, the receivers 10 are each connected to a separate terminal at the base station 16. The base station can then identify the receiver 10 from the terminal to which the receiver cable 18 is connected.

Since the transmitters 12 repeatedly send short bursts of information, an infrared carrier signals to receivers 10, there is a possibility that transmissions from different transmitters collide at the front end of a receiver 10. Although such collision garbles the information, a collision has a low probability of occurrence, and shortly after it does happen, a time separation will occur as suggested by the time separation of the receiver transmissions 20.1-20.4 to the base station 16.

The ability of receivers 10 to determine the amplitudes of received infrared bursts from transmitter 12 enables the base station 16 to determine to which receiver 10 the transmitter is closest. Hence, with the storage of data representing the receiver locations, the base station 16 can produce an indication of the location of the transmission.

The base station 22 includes a suitable microprocessor 30 which is programmed to process the data transmissions 20.1–20.4 and provide a prompt analysis from these as to where the transmitters 12 are located.

At 32 is a simplified flowchart of steps the microprocessor 30 would undertake to derive location information from transmissions 20. At 34, the program is initialized and at 35, the locations of the receivers 10 is stored. At 36, each transmission 20 is stored at a suitable location in memory with the transmitter code 22, receiver tag 24 and the amplitude signal 26.

At 38 the stored data is assembled for those multiple receptions attributable to the same transmitter by receivers 10.1 and 10.2 and more. At 40 a comparison of associated amplitude signals 26.1 and 26.2 is made and the receiver which yielded the maximum value is identified at 42. The known location of that receiver is then the approximate location of the transmitter. If only one receiver detected a transmission, then that receiver's location is the approximate location for the received transmission.

Other changes can be made without departing from the scope of the invention, an embodiment of which is presented to illustrate the invention.

What is claimed is:

1. An amplitude-shift keyed (ASK) receiver for receiving ASK modulated signals and detecting ASK modulation formed of pulses representative of one binary digit, comprising:
   means for detecting ASK modulated signals and producing a modulation signal representative of the ASK modulation thereof with pulses representative of said one binary digit;
   means for producing a delayed version of the modulation signal;
   means for producing a stretched version of the modulation signal wherein trailing edges of pulses decay at a rate selected so that the trailing edges thereof overlap in time the delayed version of the modulation signal; and
   means for comparing the delayed version of the modulation signal with the stretched version thereof to produce a high bit level data signal representative of said one binary digit during the time that said delayed version effectively exceeds said stretched version.

2. The ASK receiver as claimed in claim 1 and further comprising:
   means for generating a threshold signal greater than the noise level in the modulation signal; and
   means for comparing the threshold signal with the delayed version of the modulation signal for enabling generation of said high bit level data signal indicative of said one binary digit.

3. The ASK receiver as claimed in claim 2 wherein the threshold signal generating means generates a dynamic threshold signal which varies with the noise level in the modulation signal.

4. The ASK receiver as claimed in claim 1 wherein said means for generating said stretched version includes means for adjusting the amplitude of said stretched version so that a peak value thereof is less than a peak value of the ASK modulation signal.

5. The ASK receiver as claimed in claim 1 wherein said means for producing a stretched version includes a capacitor which is charged during the arrival of a pulse in the ASK modulation;
   means for accelerating discharge of said capacitor after said pulse has passed.

6. The ASK receiver as claimed in claim 5 wherein said means for accelerating discharge of the capacitor further includes:
   means for detecting trailing edges of pulses in the ASK modulation and producing an edge signals indicative thereof; and
   switch means activated by said edge signals to rapidly discharge said capacitor.

7. The ASK receiver as claimed in claim 1 and further including:
   means for comparing said stretched version of the modulation signal with said threshold signal for producing a pulse whose duration is representative of the time that said stretched version exceeds the threshold signal; and
   means for deriving from said pulse a digital indication representative of the amplitude of the optical carrier signals incident upon the receiver.

8. The ASK receiver as claimed in claim 7 wherein said deriving means includes
   means for counting clock pulses for the duration of said pulse to obtain a count representative of the amplitude of the incident optical carrier signals.

9. In an ASK receiver for receiving ASK modulated carrier signals and detecting ASK modulation formed of pulses representative of one binary digit and wherein the incident carrier signals are amplified, passed through a bandpass filter, and applied to a logarithmic amplifier and detector, the output of which presents an ASK modulation signal, the improvement comprising:
   a delay circuit, responsive to the ASK modulation signal and having an output;
   a pulse stretcher responsive to the ASK modulation signal and having an output;
   a threshold generator responsive to the ASK modulation signal and having an output;
   first comparator means for producing an output data pulse during the time that the output from the delay circuit exceeds the output from the pulse stretcher; and
   second comparator means for producing an enabling signal during the time that the output from the delay circuit exceeds the output from the threshold generator.

10. The improved ASK receiver as claimed in claim 9 wherein the pulse stretcher further includes a bias network which is effective to reduce the peak amplitude of the output from the pulse stretcher below the peak output level at the output of the delay circuit.

11. The improved ASK receiver as claimed in claim 9 and further including:
   third comparator means for producing an output pulse during the time the output from the pulse stretcher exceeds the output from the threshold generator.

12. The improved ASK receiver as claim in claim 11 and further including:
   means for deriving from the output of said third comparator means a digital indication representative of the amplitude of the ASK modulated carrier signal incident on the ASK receiver.

13. The improved ASK receiver as claimed in claim 10 wherein said threshold generator produces a threshold signal which varies as a function of the noise level in the ASK modulation.

14. An amplitude-shift-keyed (ASK) infrared receiver for receiving ASK modulated infrared carrier signals and detecting ASK modulation formed of pulses representative of one binary digit and an absence of pulses representative of the other binary digit, comprising:

means for detecting infrared ASK modulated carrier signals and producing a modulation signal representative of the ASK modulation thereof with pulses representative of said one binary digit;

means for producing a delayed version of the modulation signal;

means for producing a stretched version of the modulation signal wherein trailing edges of pulses decay at a rate selected so that the trailing edges thereof overlap in time the delayed version of the modulation signal;

means for comparing the delayed version of the modulation signal with the stretched version thereof to produce a high bit level data signal representative of said one binary digit during the time that said delayed version effectively exceeds said stretched version;

means for generating a threshold signal whose amplitude is a function of the noise level in the modulation signal; and means for comparing the threshold signal with the delayed version of the modulation signal for enabling generation of a bit signal indicative of said one binary digit.

15. An amplitude-shift-keyed (ASK) infrared communication system wherein a plurality of ASK transmitters send repeated bursts of information, which includes identification codes associated with respective transmitters, and is carried by ASK modulated infrared carrier signals which are incident on one or more ASK infrared receivers for demodulation by the receivers so that they can transmit binary data signals, represented by the ASK modulation, to a base station having data representative of locations of the infrared receivers, comprising:

a plurality of ASK infrared receiver means for detecting ASK modulated carrier signals and producing data signals representative of the ASK modulation of infrared carrier signals from the infrared transmitters;

said plurality of receiver means further each including:

means for deriving, from incident ASK modulated infrared carrier signals a level signal indicative of the intensity of incident infrared carrier signals; and means for transmitting said data signals, said level signal and said identification code to said base station;

wherein said base station includes:

means for comparing level signals representative of infrared carrier levels from the same infrared transmitter but at different infrared receivers and producing an indication representative of the approximate location of the transmitter associated with the compared level signals.

16. The ASK communication system in accordance with claim 15 wherein each receiver means comprises:

means for producing pulses representative of one binary digit in said ASK modulation;

means for stretching said pulses;

means for detecting a last pulse in a received infrared transmission from a transmitter; and means responsive to stretched pulses and activated after said last pulse has been detected for generating said level signal representative of the intensity of the incident infrared carrier signal.

17. An amplitude-shift-keyed (ASK) infrared communication system wherein a plurality of ASK transmitters send repeated bursts of information, which includes identification codes associated with respective transmitters, and is carried by ASK modulated infrared carrier signals which are incident on one or more ASK infrared receivers for demodulation by the receivers so that they can transmit binary data signals, represented by the ASK modulation, to a base station having data representative of locations of the infrared receivers, comprising:

a plurality of ASK infrared receiver means for detecting ASK modulated carrier signals and producing data signals representative of the ASK modulation of infrared carrier signals from the infrared transmitters;

said plurality of receiver means further each including:

means for deriving, from incident ASK modulated infrared carrier signals a level signal indicative of the intensity of incident infrared carrier signals; and means for producing an identification code representative of the identification of the receiver means; and means for transmitting said data signals, said level signal and said identification code to said base station;

wherein said base station includes:

means for comparing level signals representative of infrared carrier levels from the same infrared transmitter but at different infrared receivers and producing an indication representative of the approximate location of the transmitter associated with the compared level signals.

* * * * *